US012796141B2

(12) United States Patent
Matsuyama et al.

(10) Patent No.: US 12,796,141 B2
(45) Date of Patent: Nov. 10, 2026

(54) IMAGING DEVICE COMPRISING PIXELS WITH DIFFERENT SENSITIVITIES FOR CAPTURING IMAGES WITH HIGH DYNAMIC RANGE AND EQUIPMENT

(71) Applicant: CANON KABUSHIKI KAISHA, Tokyo (JP)

(72) Inventors: Kazunori Matsuyama, Kanagawa (JP); Noriyuki Shikina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 527 days.

(21) Appl. No.: 18/321,072

(22) Filed: May 22, 2023

(65) Prior Publication Data

US 2023/0395629 A1 Dec. 7, 2023

(30) Foreign Application Priority Data

Jun. 1, 2022 (JP) ................................ 2022-089503

(51) Int. Cl.
*H10F 39/00* (2025.01)
*H04N 25/57* (2023.01)
(Continued)

(52) U.S. Cl.
CPC ......... *H10F 39/8063* (2025.01); *H04N 25/57* (2023.01); *H04N 25/585* (2023.01);
(Continued)

(58) Field of Classification Search
CPC ............. H10F 39/8063; H10F 39/8053; H10F 39/8057; H10F 39/807; H10F 39/813;
(Continued)

(56) References Cited

U.S. PATENT DOCUMENTS 8,310,573 B2 11/2012 Hirota
8,525,906 B2 9/2013 Ui
(Continued)

FOREIGN PATENT DOCUMENTS

JP 2010-028423 A 2/2010
JP 2010-239337 A 10/2010
(Continued)

OTHER PUBLICATIONS

Office Action dated Mar. 10, 2026, in Japanese Patent Application No. 2022-089503.
(Continued)

*Primary Examiner* — Twyler L Haskins
*Assistant Examiner* — Akshay Trehan
(74) *Attorney, Agent, or Firm* — Venable LLP

(57) ABSTRACT

An imaging device includes pixels each of which includes a microlens and a plurality of photoelectric conversion units. The pixels include a first pixel and a second pixel adjacent to the first pixel, a first photoelectric conversion unit included in the first pixel and a second photoelectric conversion unit included in the second pixel are configured to share a first floating diffusion unit, sensitivity of the second photoelectric conversion unit is lower than sensitivity of the first photoelectric conversion unit in a wavelength range in which the first photoelectric conversion unit has a peak of the sensitivity, and a charge of a photoelectric conversion unit other than the first photoelectric conversion unit and the second photoelectric conversion unit is read from a floating diffusion unit different from the first floating diffusion unit in each of the first pixel and the second pixel.

15 Claims, 14 Drawing Sheets

(51) Int. Cl.
*H04N 25/585* (2023.01)
*H04N 25/59* (2023.01)
*H04N 25/76* (2023.01)
*H04N 25/778* (2023.01)

(52) U.S. Cl.
CPC ............. *H04N 25/59* (2023.01); *H04N 25/76* (2023.01); *H04N 25/778* (2023.01); *H10F 39/8053* (2025.01); *H10F 39/8057* (2025.01); *H10F 39/807* (2025.01); *H10F 39/813* (2025.01)

(58) Field of Classification Search
CPC ........ H04N 23/10; H04N 23/55; H04N 25/10; H04N 25/11; H04N 25/13; H04N 25/134; H04N 25/57–585; H04N 25/59; H04N 25/76; H04N 25/77; H04N 25/778
See application file for complete search history.

(56) References Cited

U.S. PATENT DOCUMENTS

| | | | | |
|---|---|---|---|---|
| 9,621,834 | B2 | 4/2017 | Ui | |
| 10,389,964 | B2 | 8/2019 | Taniguchi | |
| 10,498,994 | B2 | 12/2019 | Ui | |
| 10,659,713 | B2 | 5/2020 | Shikina | |
| 11,196,955 | B2 | 12/2021 | Ui | |
| 11,202,023 | B2 | 12/2021 | Shigiya | |
| 11,303,829 | B2 | 4/2022 | Shigiya | |
| 11,490,041 | B2 | 11/2022 | Shigiya | |
| 11,595,606 | B2 | 2/2023 | Shikina | |
| 11,627,264 | B2 | 4/2023 | Igarashi | |
| 11,700,467 | B2 | 7/2023 | Shikina | |
| 2010/0013969 | A1* | 1/2010 | Ui | H04N 25/581 348/294 |
| 2013/0258098 | A1* | 10/2013 | Ikemoto | G01S 11/12 348/135 |
| 2013/0313411 | A1 | 11/2013 | Ui | |
| 2017/0110503 | A1* | 4/2017 | Kato | H04N 25/778 |
| 2017/0150082 | A1 | 5/2017 | Ui | |
| 2020/0059622 | A1 | 2/2020 | Ui | |
| 2020/0411578 | A1 | 12/2020 | Tanaka et al. | |
| 2021/0044766 | A1 | 2/2021 | Shikina | |
| 2023/0209217 | A1 | 6/2023 | Shimada | |

FOREIGN PATENT DOCUMENTS

| | | | | | |
|---|---|---|---|---|---|
| JP | 2014033054 | A | * | 2/2014 | H01L 27/14 |
| JP | 2014-090214 | A | | 5/2014 | |
| JP | 2015-072987 | A | | 4/2015 | |
| JP | 2021-005752 | A | | 1/2021 | |

OTHER PUBLICATIONS

Office Action dated Aug. 18, 2026, in Japanese Patent Application No. 2022-089503.

* cited by examiner

IMAGING DEVICE COMPRISING PIXELS WITH DIFFERENT SENSITIVITIES FOR CAPTURING IMAGES WITH HIGH DYNAMIC RANGE AND EQUIPMENT

BACKGROUND OF THE INVENTION

Field of the Invention

The present disclosure relates to a configuration of an imaging device, and particularly relates to a pixel configuration in which a plurality of photoelectric conversion elements share a floating diffusion and pixels having different sensitivities are provided.

Description of the Related Art

In recent years, an imaging device is used as sensing means for implementing automated driving and driving assistance function of an automobile. In the automated driving, performance which detects an object and measures a distance to the object irrespective of ambient brightness or the like is required, and hence performance capable of acquiring an image in a high dynamic range is required. As a method of increasing the dynamic range, a method which synthesizes images having different exposure periods and a method which synthesizes a plurality of images based on charges acquired from pixels having different sensitivities are known. In the case where HDR synthesis processing is performed with one imaging device, exposure timing differs in the former, and it is necessary to perform matching of differences in blurring amount and movement positions of an object in the imaging device mounted on an automobile which moves at high speed. Accordingly, in the case where the HDR synthesis processing is performed with one imaging device, it is preferable to adopt the latter in theory.

In addition, with regard to distance measurement function, while distance measurement is often performed by calculating parallax information from images acquired by using two imaging devices spaced apart from each other in a horizontal direction, a plurality of devices are necessary, and hence a problem arises in that cost is high. In contrast, a method in which a plurality of photoelectric conversion units are disposed under one microlens and distance measurement is performed on the basis of a lateral difference is known as the technique of autofocus of an imaging device or the like. With this, it is possible to reduce the number of imaging devices and suppress cost.

In enlargement of the dynamic range, it is necessary to increase sensitivity in low light, and hence a method which increases an area of a photoelectric conversion unit is used as an example. For example, there is known a method in which a plurality of photoelectric conversion units share one floating diffusion (FD) and the area of the photoelectric conversion unit is increased while an increase in the number of pixel circuits is suppressed. For example, according to Japanese Patent Application Publication No. 2010-028423, in a configuration in which four photoelectric conversion units share one FD, a structure in which charges are read from the same FD for increasing an area of a light receiving unit is disclosed. In addition, Japanese Patent Application Publication No. 2014-33054 discloses a method in which the position of an FD is moved from a position immediately under a microlens and an area of a photoelectric conversion unit is further increased. In this configuration, it is possible to read charges of four photoelectric conversion units under the same microlens from different FDs simultaneously.

In the case of Japanese Patent Application Publication No. 2010-028423, charges of the individual photoelectric conversion units are read from the same FD, and hence it is necessary to perform the reading a plurality of times. Accordingly, in order to determine parallax, it is necessary to accumulate a pixel signal based on the charge read earlier in a memory until a desired parallax image is obtained. In addition, Japanese Patent Application Publication No. 2010-028423 also discloses a configuration in which charges are read simultaneously from different FDs provided in the individual photoelectric conversion units. In this case, the accumulation of the pixel signal in the memory becomes unnecessary, but a photosensitive area is reduced as compared with the configuration in which the pixel signal is accumulated in the memory. On the other hand, in the case of Japanese Patent Application Publication No. 2014-33054, charges of the photoelectric conversion units under the same microlens are read from different FDs, and hence it becomes possible to read the parallax image simultaneously, and it is possible to suppress a memory amount for parallax acquisition as compared with the configuration of Japanese Patent Application Publication No. 2010-028423.

In addition, for the enlargement of the dynamic range, it is required that saturation does not occur even in high light. As a mechanism for balancing a high-sensitivity pixel and a low-sensitivity pixel, for example, Japanese Patent Application Publication No. 2010-028423 discloses a configuration in which, in the low-sensitivity pixel, light input into the photoelectric conversion unit is reduced as compared with that of the high-sensitivity pixel by covering incident light with a light-shielding unit.

However, Japanese Patent Application Publication No. 2010-028423 has the configuration in which the charges of one pixel are read from the common FD, and hence it is necessary to provide a memory for HDR synthesis processing and acquisition of parallax information, and a circuit scale is increased. In addition, in the case where reading from the individual FDs is performed, while it is possible to read charges for images having a plurality of sensitivities simultaneously, a non-photosensitive area is increased, and sensitivity is reduced.

In Japanese Patent Application Publication No. 2014-33054, no consideration is given to the placement of photoelectric conversion units having a difference in sensitivity in the case where pixels having different sensitivities are provided for enlarging the dynamic range. Consequently, in Japanese Patent Application Publication No. 2014-33054, the task of acquiring a high dynamic range image and parallax information with a minimum memory configuration is not assumed.

SUMMARY OF THE INVENTION

The present disclosure has been achieved in view of the foregoing, and an object thereof is to provide an imaging device capable of simultaneously acquiring charges for images having different sensitivities in a configuration in which a plurality of photoelectric conversion units are disposed under a microlens.

According to some embodiments, an imaging device includes a plurality of pixels each of which includes a microlens and a plurality of photoelectric conversion units, wherein the plurality of pixels include a first pixel and a second pixel adjacent to the first pixel, a first photoelectric conversion unit included in the first pixel and a second photoelectric conversion unit included in the second pixel are configured to share a first floating diffusion unit, sensitivity of the second photoelectric conversion unit is lower than sensitivity of the first photoelectric conversion unit in a wavelength range in which the first photoelectric conversion unit has a peak of the sensitivity, and a charge of a photoelectric conversion unit other than the first photoelectric conversion unit and the second photoelectric conversion unit is read from a floating diffusion unit different from the first floating diffusion unit in each of the first pixel and the second pixel.

According to some embodiments, an imaging device includes a plurality of pixels each of which includes a microlens and a plurality of photoelectric conversion units, wherein the plurality of pixels include a seventh pixel, an eighth pixel adjacent to the seventh pixel, a ninth pixel adjacent to the eighth pixel, and a tenth pixel adjacent to the ninth pixel, a seventh photoelectric conversion unit included in the seventh pixel, an eighth photoelectric conversion unit included in the eighth pixel, a ninth photoelectric conversion unit included in the ninth pixel, and a tenth photoelectric conversion unit included in the tenth pixel are configured to share a second floating diffusion unit, in a wavelength range in which one of at least two photoelectric conversion units out of the seventh to tenth photoelectric conversion units has a peak of sensitivity, another one of the at least two photoelectric conversion units has sensitivity different from the sensitivity of the one of the at least two photoelectric conversion units, and a charge of a photoelectric conversion unit other than the seventh to tenth photoelectric conversion units is read from a floating diffusion unit different from the second floating diffusion unit in each of the seventh to tenth pixels.

According to some embodiments, equipment including the imaging device as described above, the equipment further including at least any of an optical device which is compliant with the imaging device, a control device which controls the imaging device, a processing device which processes a signal output from the imaging device, a display device which displays information obtained by the imaging device, a storage device which stores the information obtained by the imaging device, and a mechanical device which operates on the basis of the information obtained by the imaging device.

Further features of the present invention will become apparent from the following description of exemplary embodiments with reference to the attached drawings.

DESCRIPTION OF THE EMBODIMENTS

Figure 1:
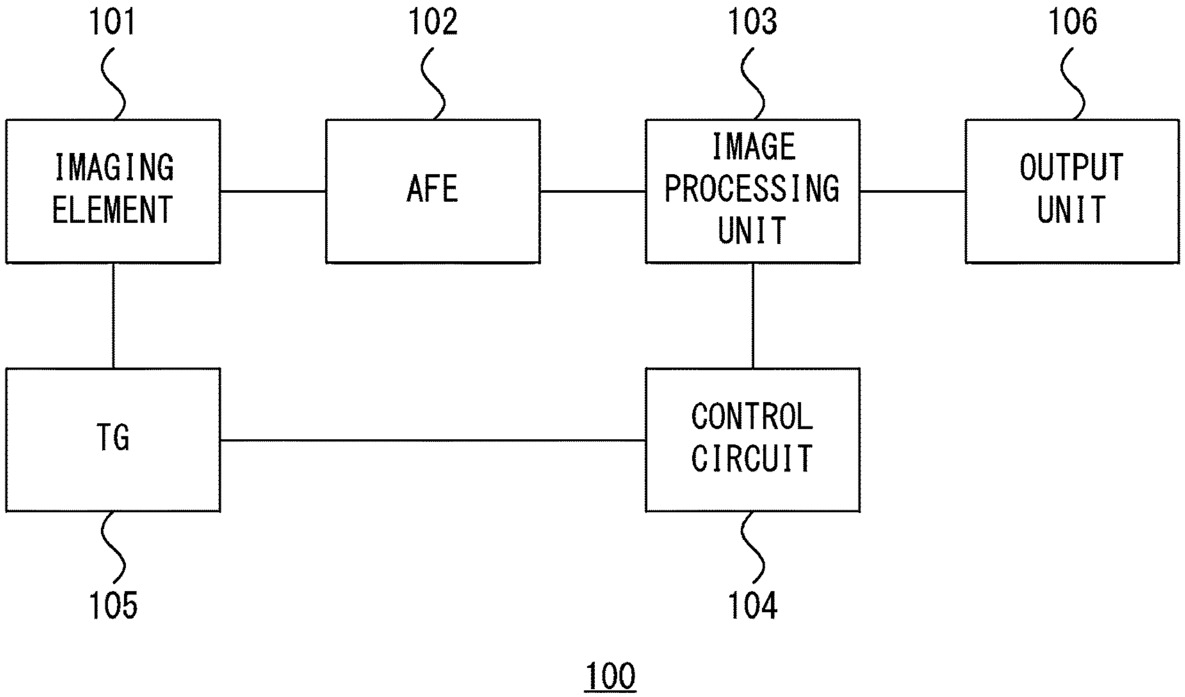
FIG. 1 is a block diagram showing a configuration of a solid-state imaging device according to a first embodiment.

Hereinbelow, embodiments of the present disclosure will be described by using the drawings. Note that the present disclosure is not limited to the following embodiments, and can be changed appropriately without departing from the gist thereof. In addition, in the drawings described below, components having the same function are designated by the same reference numeral and the description thereof will be omitted or simplified in some cases.

First Embodiment

Hereinbelow, a description will be given of a solid-state imaging device which is an example of an imaging device in a first embodiment. FIG. 1 is a view showing an example of a schematic configuration of a solid-state imaging device 100 according to the first embodiment. A CMOS (Complementary Metal Oxide Semiconductor) solid-state imaging element 101 has a structure including two or more pixels having different sensitivities, and receives an optical image formed by an optical system which is not shown. An analog front end (AFE) 102 performs adjustment and amplification of a reference level and analog-digital conversion processing. An image processing unit 103 receives digital output of each pixel, and performs correction of an image signal, rearrangement of pixels, acquisition of distance data from parallax information described later, and synthesis of outputs of photoelectric conversion elements having different sensitivities to thereby synthesize a high dynamic range (HDR) image. A control circuit 104 controls the individual units of the solid-state imaging device 100 in a centralized manner, and includes a known CPU and the like. A timing generation circuit (TG) 105 generates various timings for driving the solid-state imaging element 101. An output unit 106 outputs image data generated by the image processing unit 103 to the outside.

Figure 2:
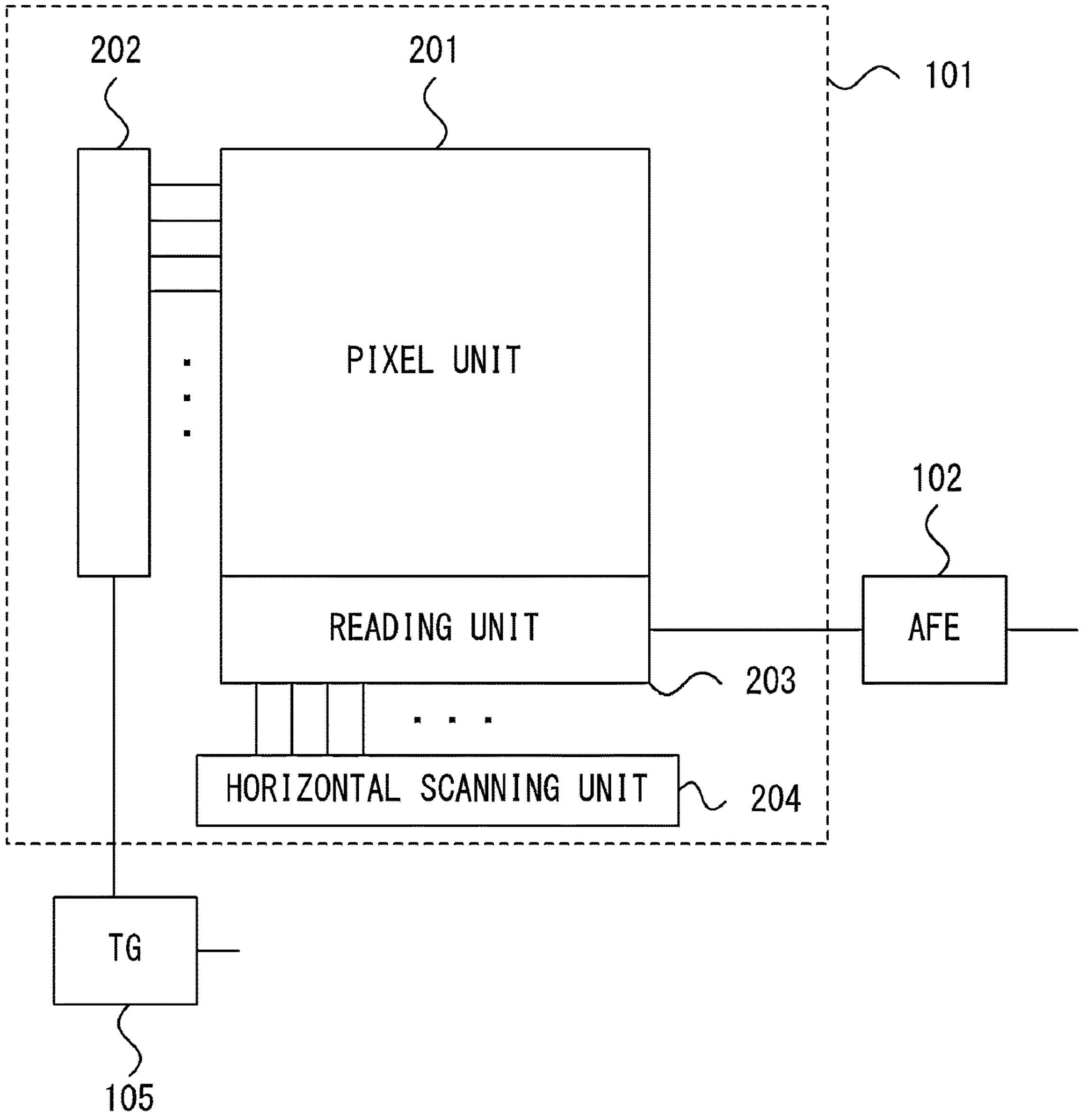
FIG. 2 is a view showing a configuration of a solid-state imaging element according to the first embodiment.

In addition, as shown in FIG. 2, the solid-state imaging element 101 has a pixel unit 201, a vertical scanning unit 202, a reading unit 203, and a horizontal scanning unit 204. In the pixel unit 201, a plurality of unit pixels are disposed in a matrix, and the pixel unit 201 receives an optical image formed by an optical system which is not shown. The vertical scanning unit 202 selects a plurality of rows of the pixel unit 201 sequentially and the horizontal scanning unit 204 selects a plurality of columns of the pixel unit 201 sequentially, whereby the plurality of unit pixels of the pixel unit 201 are selected sequentially. The reading unit 203 reads signals of the unit pixels selected by the vertical scanning unit 202 and the horizontal scanning unit 204, and outputs the read signals to the AFE 102.

Figure 3:
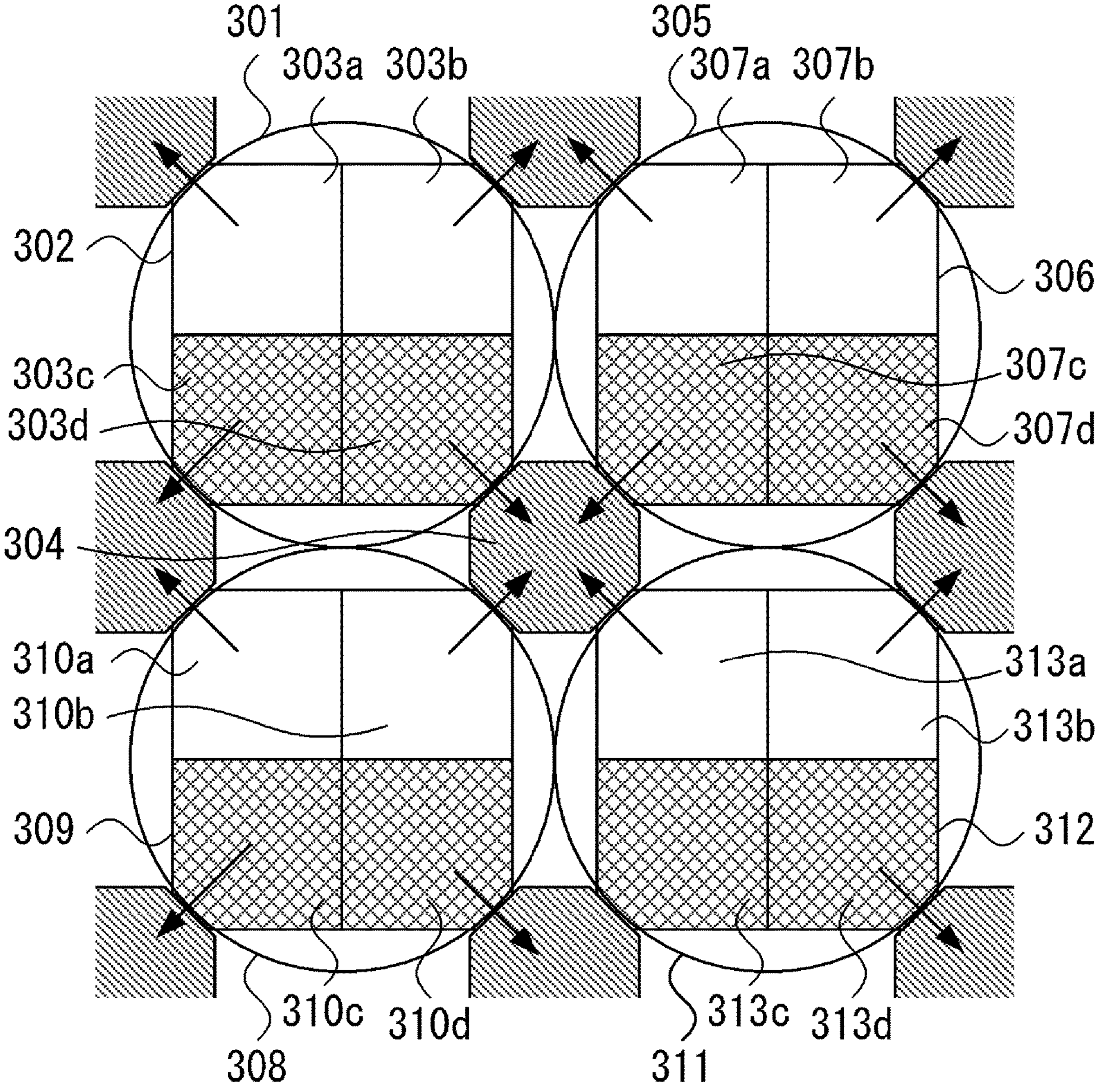
FIG. 3 is a view showing a configuration of a pixel unit according to the first embodiment.

FIG. 3 describes a configuration of the pixel unit 201 in the solid-state imaging element 101. While only four unit pixels are shown for the convenience of description, the pixel unit 201 is actually constituted by further disposing a plurality of such unit pixels. In addition, in FIG. 3, a floating diffusion unit (FD (Floating Diffusion) unit; floating diffusion layer) serving as a destination of reading of a charge of a photoelectric conversion unit is indicated by arrows.

As shown in FIG. 3, in the pixel unit 201, one unit pixel 302 is provided for one microlens 301. The unit pixel 302 has four photoelectric conversion units 303*a* to 303*d* including two photoelectric conversion units obtained by division in a vertical direction (up-and-down direction on a paper sheet) and two photoelectric conversion units obtained by division in a horizontal direction (left-to-right direction on the paper sheet). The photoelectric conversion units 303*a* to 303*d* perform photoelectric conversion on light received from an optical system and perform accumulation of charges. In a wavelength range in which one of at least two photoelectric conversion units out of the photoelectric conversion units 303*a* to 303*d* has a peak of sensitivity, the other one of the at least two photoelectric conversion units has sensitivity different from the sensitivity of one of the at least two photoelectric conversion units. More specifically, each of the photoelectric conversion units 303*c* and 303*d* includes a light-shielding unit described later in an incidence unit, and hence the sensitivity of each of the photoelectric conversion units 303*c* and 303*d* is lower than the sensitivity of each of the photoelectric conversion units 303*a* and 303*b*, and an amount of charges generated in the case where exposure is performed for the same time period is smaller than that of each of the photoelectric conversion units 303*a* and 303*b*. In the solid-state imaging element 101, charges accumulated in each photoelectric conversion unit is read into the reading unit 203 via the FD. In the present embodiment, photoelectric conversion units 303*d*, 307*c*, 310*b*, and 313*a* of four adjacent unit pixels 302, 306, 309, and 312 share an FD 304. Note that, between each photoelectric conversion unit and the FD, a transfer switch for controlling transfer of charges to the FD from the photoelectric conversion unit is actually disposed, but the transfer switch is omitted in FIG. 3 for the convenience of description, and the detailed configuration thereof will be described later. Note that, in the present embodiment, the unit pixel means a circuit group including a plurality of the photoelectric conversion units and the FD which are disposed under one microlens.

Figure 4A:
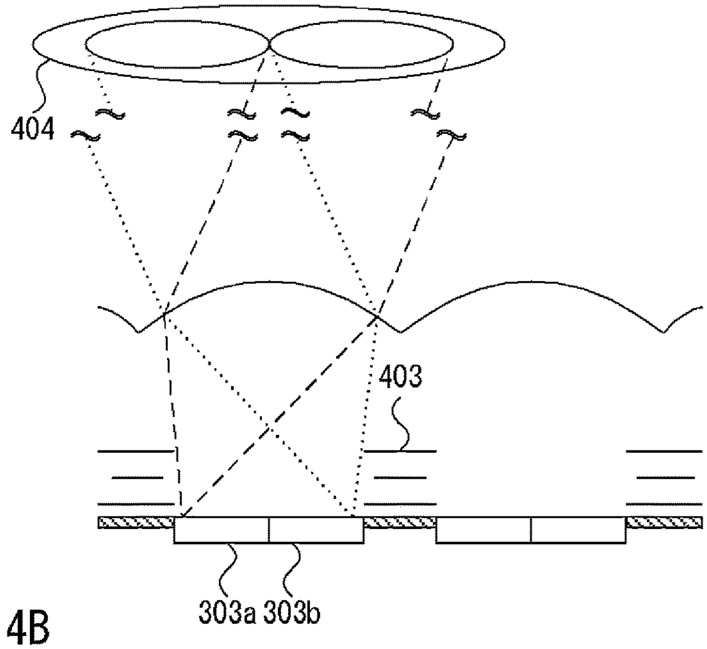
FIGS. 4A to 4C are detail views showing the configuration of the pixel unit according to the first embodiment.
Figure 4B:
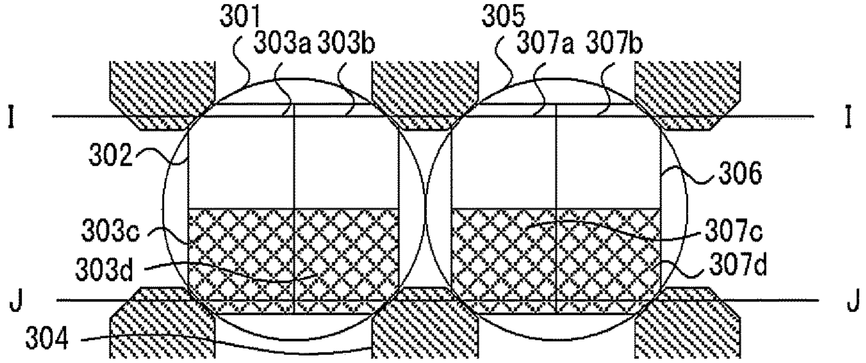
Figure 4C:
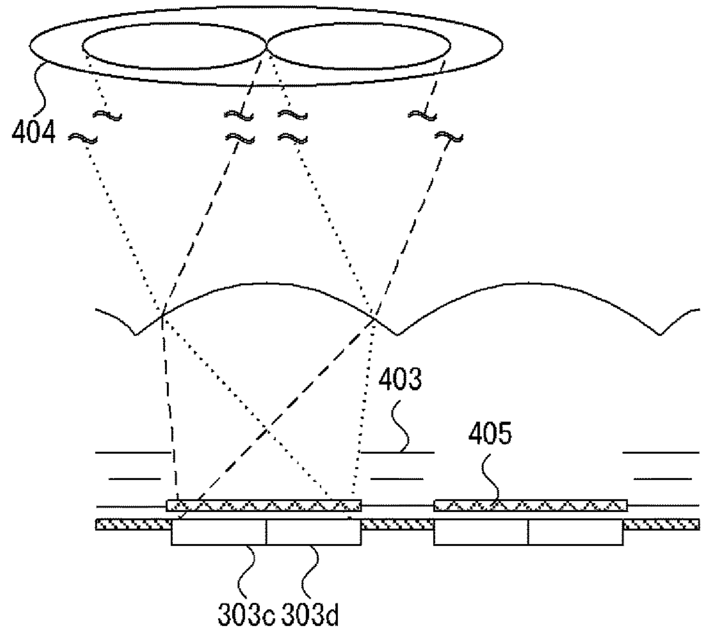

Each of FIGS. 4A to 4C shows the placement of the photoelectric conversion units of the present embodiment. For the convenience of description, attention is focused on two unit pixels 302 and 306. FIG. 4A is a cross-sectional view taken along the line I-I of FIG. 4B, and shows a state in which the photoelectric conversion units receive light emitted from an exit pupil 404 of a photographing lens via the microlens 301. The divided photoelectric conversion units 303*a* and 303*b* receive lights emitted from different areas of the exit pupil 404. FIG. 4C is a cross-sectional view taken along the line J-J of FIG. 4B. In the present embodiment, in order to reduce the sensitivity of each of the photoelectric conversion units 303*c* and 303*d*, a light-shielding unit 405 is provided above the photoelectric conversion units 303*c* and 303*d*. With regard to the light-shielding unit 405, incident light may be attenuated by forming a light-shielding film in an incidence unit of light or by forming color filters in the photoelectric conversion units 303*c* and 303*d* which have different light transmittances. The material and the configuration of the light-shielding unit 405 may be any material and any configuration as long as the light-shielding unit 405 functions as means for attenuating the amount of charges generated in the photoelectric conversion unit to the incident light. With this, each of the photoelectric conversion units 303*a* and 303*b* has high sensitivity and each of the photoelectric conversion units 303*c* and 303*d* has low sensitivity. In addition, while the present embodiment shows a configuration in which the high-sensitivity photoelectric conversion unit is disposed in an upper portion in the unit pixel and the low-sensitivity photoelectric conversion unit is disposed in a lower portion in the unit pixel in a plan view of the unit pixels constituting the pixel unit 201, the high-sensitivity photoelectric conversion unit and the low-sensitivity photoelectric conversion may be disposed reversely. Further, a configuration may also be adopted in which, in the unit pixel, color filters of the same color are disposed in the individual photoelectric conversion units, and a single unit pixel allows transmission of light having the same color.

Figure 5:
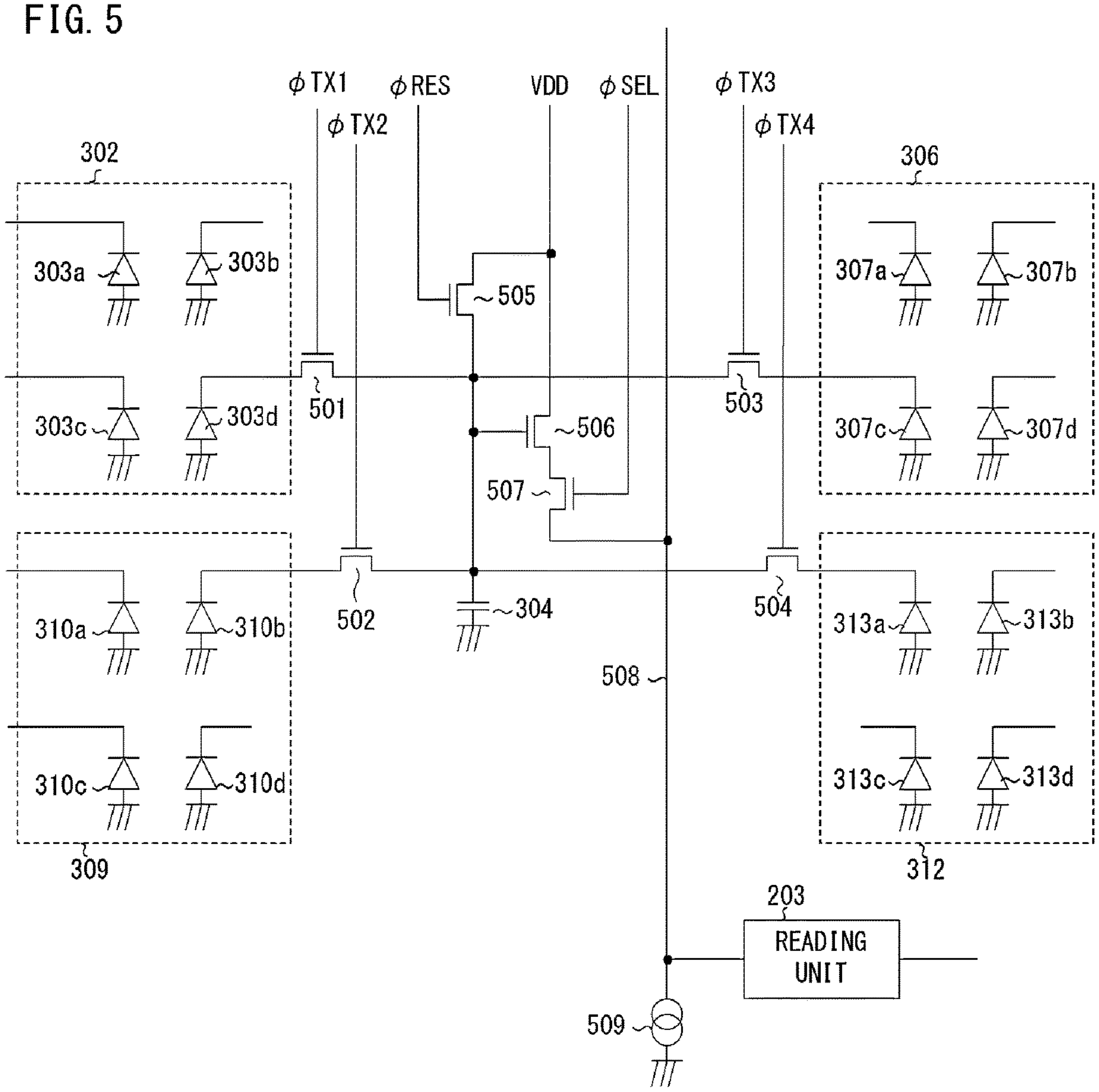
FIG. 5 is an equivalent circuit diagram of the pixel unit according to the first embodiment.

FIG. 5 is an equivalent circuit of the pixel unit 201. For the convenience of description, FIG. 5 shows only four unit pixels 302, 306, 309, and 312 including the photoelectric conversion units sharing the FD 304. The pixel unit 201 is constituted by two-dimensionally arranging unit pixels similar to the unit pixels 302, 306, 309, and 312. In addition, while FIG. 5 shows only the reading unit in one column, the reading unit 203 is constituted by disposing a plurality of similar reading units for each column.

In FIG. 5, photoelectric conversion units 303*a* to 303*d* of the unit pixel 302, photoelectric conversion units 307*a* to 307*d* of the unit pixel 306, photoelectric conversion units 310*a* to 310*d* of the unit pixel 309, and photoelectric conversion units 313*a* to 313*d* of the unit pixel 312 are shown as photodiodes (PD). Each photoelectric conversion unit receives light of each area of the exit pupil, generates a charge corresponding to a light reception amount, and accumulates the charge.

A charge transfer switch 501 is driven by a transfer pulse signal ϕTX1, and transfers the charge accumulated by the photoelectric conversion unit 303*d* to the FD 304. A charge transfer switch 502 is driven by a transfer pulse signal ϕTX2, and transfers the charge accumulated by the photoelectric conversion unit 310*b* to the FD 304. A charge transfer switch 503 is driven by a transfer pulse signal ϕTX3, and transfers the charge accumulated by the photoelectric conversion unit 307*c* to the FD 304. A charge transfer switch 504 is driven by a transfer pulse signal ϕTX4, and transfers the charge accumulated by the photoelectric conversion unit 313*a* to the FD 304. The FD 304 is configured to be able to retain transferred charges.

The photoelectric conversion units in the unit pixels 302, 306, 309, and 312 other than those described above share FDs with adjacent pixels which are not shown. A reset switch 505 is driven by a reset pulse signal ϕRES, and supplies a reference potential VDD to the FD 304. The FD 304 retains charges which are transferred from the photoelectric conversion units 303*d*, 307*c*, 310*b*, and 312*a* via the charge transfer switches 501, 502, 503, and 504. In addition, the FD 304 functions as a charge-voltage conversion unit which converts the retained charge to a voltage signal.

An amplification unit 506 amplifies the voltage signal based on the charge retained in the FD 304, and outputs the voltage signal as a pixel signal. In FIG. 5, a source follower circuit which uses a MOS transistor and a constant current source 509 is shown as an example.

A selection switch 507 is driven by a vertical selection pulse signal ϕSEL, and a signal amplified in the amplification unit 506 is output to a vertical signal line 508. The signal output to the vertical signal line 508 is read by the reading unit 203 provided for each column, and is then output to the AFE 102.

Herein, when attention is focused on the unit pixel 302, the photoelectric conversion units 303*a* to 303*d* are connected to different FDs. Accordingly, it is possible to read charges accumulated by the individual photoelectric conversion units constituting the unit pixel 302 from different vertical lines simultaneously. Specifically, charges for a high-sensitivity image having lateral parallax are read from the photoelectric conversion units 303*a* and 303*b*, and charges for a low-sensitivity image having lateral parallax are read from the photoelectric conversion units 303*c* and 303*d*. On the other hand, the unit pixels 306, 309, and 312 share the FD 304 with the unit pixel 302. Accordingly, in a period in which charges are read in the unit pixel 302, it is not possible to read charges in the unit pixels 306, 309, and 312. That is, in the four unit pixels 302, 306, 309, and 312 which share the FD 304, reading of charges is performed sequentially. Herein, as an example, the unit pixels 302, 306, 309, and 312 are seventh, eighth, ninth, and tenth pixels, and the photoelectric conversion units 303*d*, 307*c*, 310*b*, and 313*a* are seventh, eighth, ninth, and tenth photoelectric conversion units. In addition, the photoelectric conversion unit 303*c* is an example of an adjacent photoelectric conversion unit which is adjacent to the seventh photoelectric conversion unit in a horizontal direction. Further, the FD 304 is an example of a second floating diffusion unit.

The AFE 102 performs AD conversion which converts an analog charge input from the unit pixel to a digital signal. The digital signal output from the AFE 102 is input to the image processing unit 103. The image processing unit 103 performs high dynamic range image generation processing by using images having different sensitivities based on charges read from the solid-state imaging element.

The image processing unit 103 is a distance measurement processing unit which acquires a parallax image based on charges read from the floating diffusion unit and performs distance measurement processing, and performs the distance measurement processing by using the digital signal input from the AFE 102. In the distance measurement processing, a high-sensitivity image A acquired from a photoelectric conversion unit group A (the photoelectric conversion units 303*a*, 307*a*, and the like in FIG. 3) and a high-sensitivity image B acquired from a photoelectric conversion unit group B (the photoelectric conversion units 303*b*, 307*b*, and the like in FIG. 3) are converted to distance information. For example, it is assumed that a given object is formed into an image in the photoelectric conversion unit 303*a* in the photoelectric conversion unit group A, and is formed into an image in the photoelectric conversion unit 307*b* in the photoelectric conversion unit group B. Herein, when it is assumed that a distance to the object is X, a baseline length is B, a focal length is F, and a distance between the photoelectric conversion unit 303*a* and the photoelectric conversion unit 307*b* is D, X=BF/D is satisfied. Note that the distance D is calculated from a difference in the number of pixels calculated by performing matching processing of the high-sensitivity image A and the high-sensitivity image B, and a physical size of one pixel.

Similarly, distance measurement processing is performed from a low-sensitivity image C acquired from a low-sensitivity photoelectric conversion unit group C (the photoelectric conversion units 303*c*, 307*c*, and the like in FIG. 3) and a low-sensitivity image D acquired from a photoelectric conversion unit group D (the photoelectric conversion units 303*d*, 307*d*, and the like in FIG. 3). Distance information having higher reliability is selected on the basis of a processing result of images having different sensitivities and is output as distance information. The distance measurement method is only an example, and is not limited to the present method.

Figure 6:
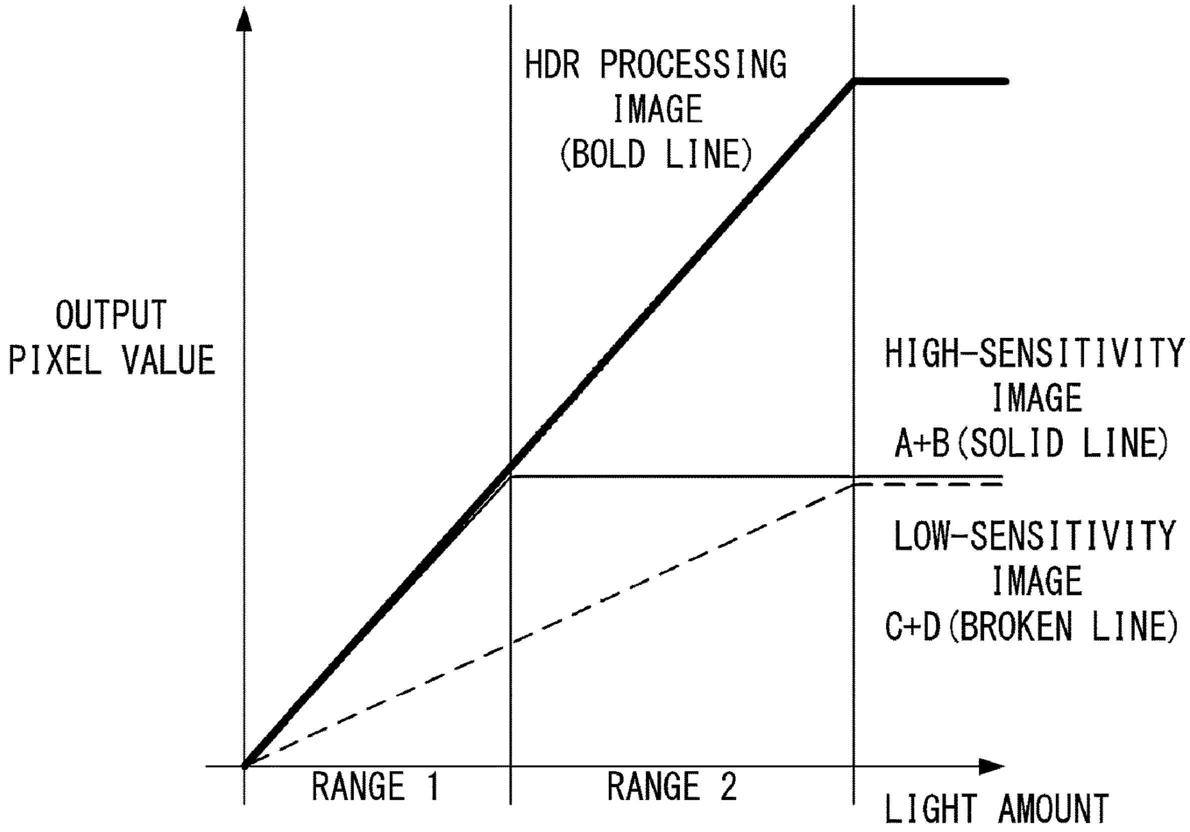
FIG. 6 is a view showing an outline of HDR processing according to the first embodiment.

In addition, the image processing unit 103 performs HDR synthesis processing by using the high-sensitivity images A and B and the low-sensitivity images C and D. Herein, a description will be given of an example of the HDR synthesis processing executed in the present embodiment. First, a high-sensitivity image with no parallax is produced by using the high-sensitivity image A and the high-sensitivity image B. Similarly, a low-sensitivity image with no parallax is produced by using the low-sensitivity image C and the low-sensitivity image D. Next, normalization processing to an output value in the case where the low-sensitivity combined image has sensitivity equal to that of the high-sensitivity combined image is performed on the low-sensitivity combined image. Thereafter, as shown in FIG. 6, in a light amount range in low light ("Range 1"), a pixel value of the high-sensitivity image having little noise is selected as an output value after HDR synthesis. On the other hand, in a light amount range in which a high-sensitivity pixel is saturated ("Range 2"), a pixel value of the normalized low-sensitivity image is selected as an output value after the HDR synthesis. The HDR synthesis processing may also be performed by a known method which performs boundary processing between Range 1 and Range 2, and the detailed description thereof will be omitted.

Figure 7:
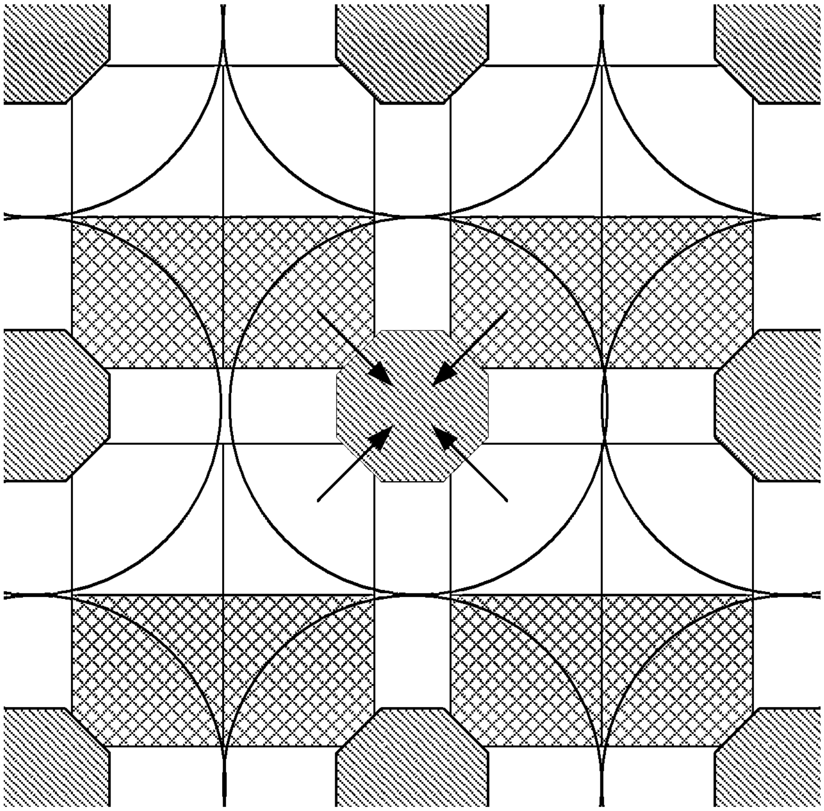
FIG. 7 is a view showing a configuration of a pixel unit in a conventional art.

Herein, a description will be given of distance measurement processing and HDR synthesis processing in a configuration of a conventional solid-state imaging device, and a description will be given of effects of the present embodiment. For example, in the configuration disclosed in Japanese Patent Application Publication No. 2010-028423, as can be seen from arrows shown in FIG. 7, charges of a plurality of photoelectric conversion units having different sensitivities in pixels under one microlens are read from the same FD. In this configuration, it is necessary to transfer charges of the pixels a plurality of times, and hence a memory such as a line memory for retaining a digital signal based on the charge for an image of each sensitivity required for the HDR processing becomes necessary.

In addition, in the configuration disclosed in Japanese Patent Application Publication No. 2014-33054, charges of a plurality of photoelectric conversion units in a pixel under one microlens are read from different FDs, but no consideration is given to the placement of the photoelectric conversion units having different sensitivities. Accordingly, in Japanese Patent Application Publication No. 2014-33054, depending on a formation position of a light-shielding unit, it is not possible to read charges of the photoelectric conversion units having different sensitivities simultaneously, and a memory for performing the distance measurement processing and the HDR synthesis described above becomes necessary.

Consequently, according to the configuration of the solid-state imaging device according to the present embodiment, the memory for retaining the digital signal based on the charge of the photoelectric conversion unit becomes unnecessary in the distance measurement processing and the HDR synthesis processing. In addition, there is also a configuration in which the image processing unit (distance measurement processing unit) includes a memory. In this case, it is possible to perform the distance measurement processing and the HDR synthesis processing without causing the memory to retain the digital signal. With this, it can be said that the solid-state imaging device according to the present embodiment is superior to the conventional art described above in terms of a circuit scale and power consumption.

Second Embodiment

Figure 8:
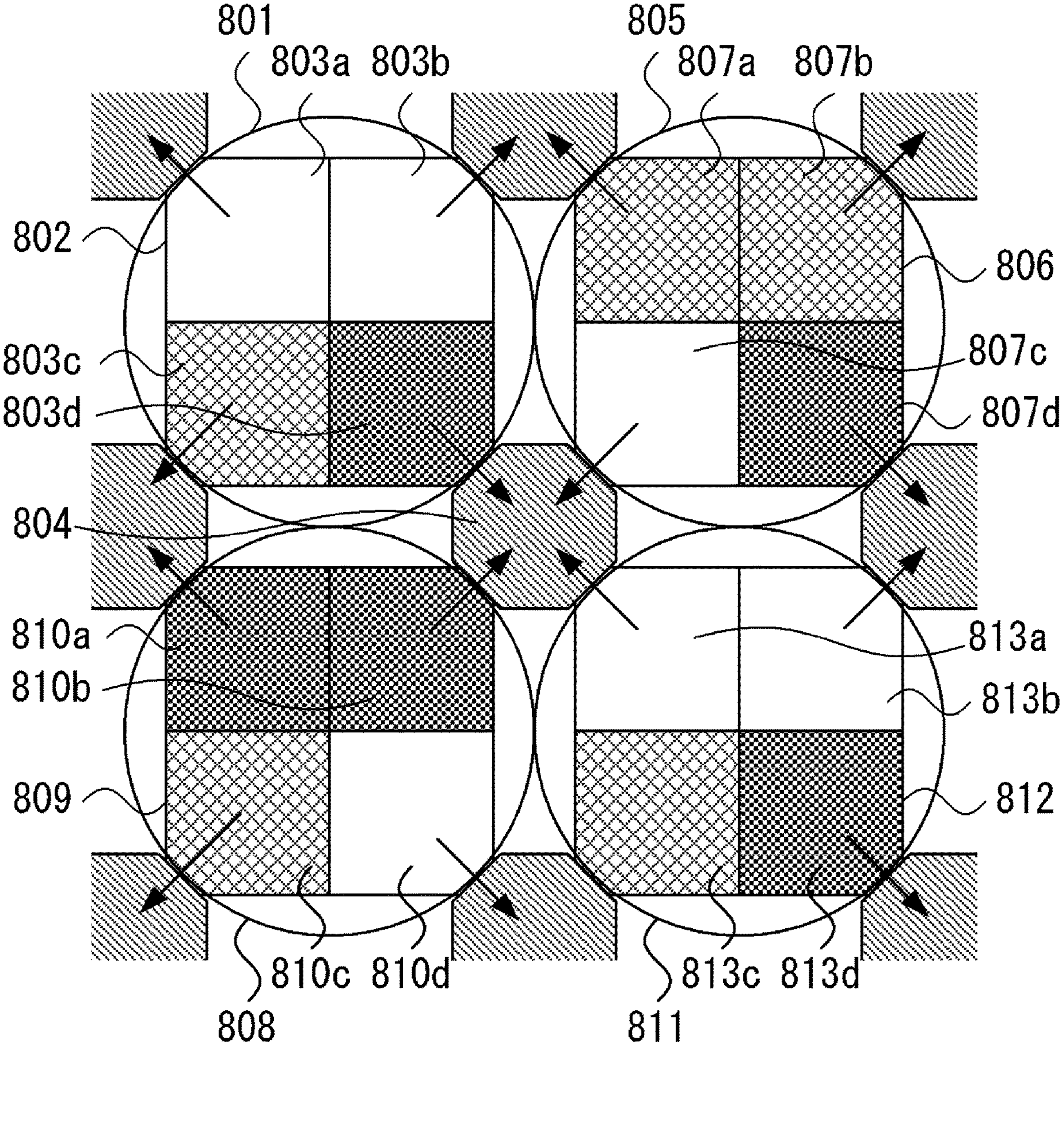
FIG. 8 is a view showing a structure of a pixel unit according to a second embodiment.

Next, a description will be given of a solid-state imaging device according to a second embodiment. In the present embodiment, in order to enlarge the dynamic range such that the enlarged dynamic range becomes wider than that in the configuration of the solid-state imaging element in the first embodiment, a unit pixel having three different sensitivities is provided, as shown in an example in FIG. 8. In FIG. 8, each of photoelectric conversion units 803*a* and 803*b* (a white portion in the drawing) in a unit pixel 802 has high sensitivity, and can acquire a high-sensitivity image A and a high-sensitivity image B having parallax. A photoelectric conversion unit 803*c* (a sparsely hatched portion in the drawing) has medium sensitivity. In addition, a photoelectric conversion unit 803*d* (a densely hatched portion in the drawing) has low sensitivity. Light-shielding units are formed at positions where the light-shielding units overlap the photoelectric conversion units 803*c* and 803*d* in a plan view of the unit pixels constituting the pixel unit 201. The transmittance of the light-shielding unit formed above the photoelectric conversion unit 803*d* is lower than the transmittance of the light-shielding unit formed above the photoelectric conversion unit 803*c*.

In addition, in a unit pixel 806, similarly to the photoelectric conversion unit 803*c*, each of photoelectric conversion units 807*a* and 807*b* has medium sensitivity, and the photoelectric conversion units 807*a* and 807*b* can acquire a medium-sensitivity image A and a medium-sensitivity image B having parallax. Further, similarly to the photoelectric conversion units 803*a* and 803*b*, a photoelectric conversion unit 807*c* has high sensitivity and, similarly to the photoelectric conversion unit 803*d*, a photoelectric conversion unit 807*d* has low sensitivity.

In addition, in a unit pixel 809, similarly to the photoelectric conversion unit 803*d*, each of photoelectric conversion units 810*a* and 810*b* has low sensitivity, and the photoelectric conversion units 810*a* and 810*b* can acquire a low-sensitivity image A and a low-sensitivity image B having parallax. Further, similarly to the photoelectric conversion unit 803*c*, a photoelectric conversion unit 810*c* has medium sensitivity and, similarly to the photoelectric conversion units 803*a* and 803*b*, a photoelectric conversion unit 810*d* has high sensitivity. Photoelectric conversion units of a unit pixel 812 are configured similarly to the photoelectric conversion units of the unit pixel 802.

According to the configuration described above, it is possible to perform the distance measurement processing by using the images output from the photoelectric conversion units having the same sensitivity. In addition, in the case where the output images of the photoelectric conversion units having different sensitivities are used, it is also possible to perform the distance measurement processing in the case where the sensitivities of the photoelectric conversion units are normalized, the high sensitivity side is not saturated, and the low sensitivity side can secure an adequate SN ratio.

Figure 9:
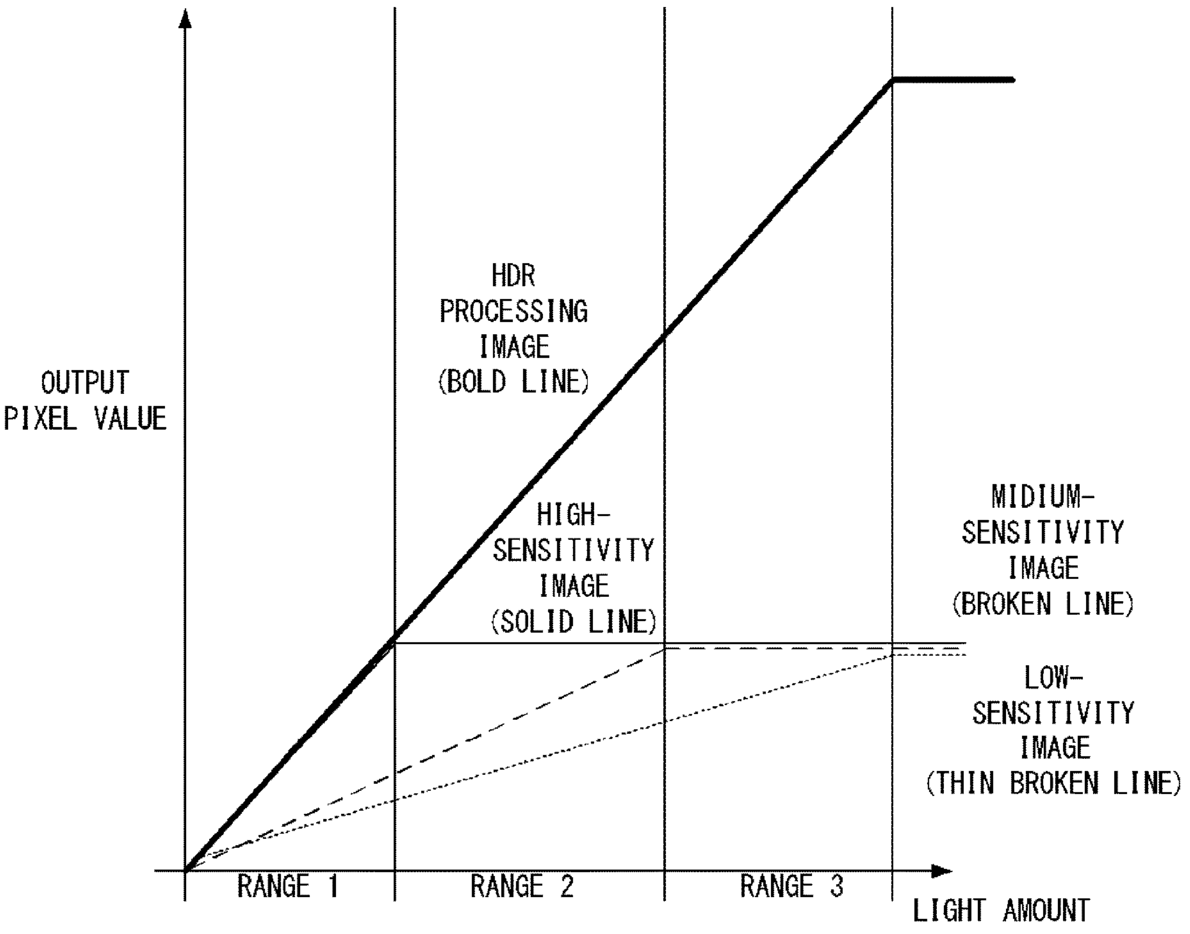
FIG. 9 is a view showing an outline of HDR processing according to the second embodiment.

In addition, in the HDR processing, as shown in FIG. 9, the HDR synthesis processing is performed by normalizing and using the pixel values of three images having different sensitivities, and selecting the pixel value according to the light amount range. In FIG. 9, the low-sensitivity image is selected in Range 1, the medium-sensitivity image is selected in Range 2, and the high-sensitivity image is selected in Range 3. The placement of the photoelectric conversion units having different sensitivities differs from one unit pixel to another, and hence, when the HDR processing is executed, the position input to the processing is appropriately switched.

Consequently, according to the present embodiment, also in the configuration in which the unit pixel includes the photoelectric conversion units having three different sensitivities, it is possible to simultaneously read charges used to generate the image having lateral parallax and the images having different sensitivities, similarly to the first embodiment. With this, in the distance measurement processing and the HDR synthesis processing, a memory for retaining a digital signal based on charges read from the photoelectric conversion units in the same unit pixel becomes unnecessary. In addition, there is also a configuration in which the image processing unit (distance measurement processing unit) includes a memory. In this case, it is possible to perform the distance measurement processing and the HDR synthesis processing without causing the memory to retain the digital signal.

Third Embodiment

Figure 10:
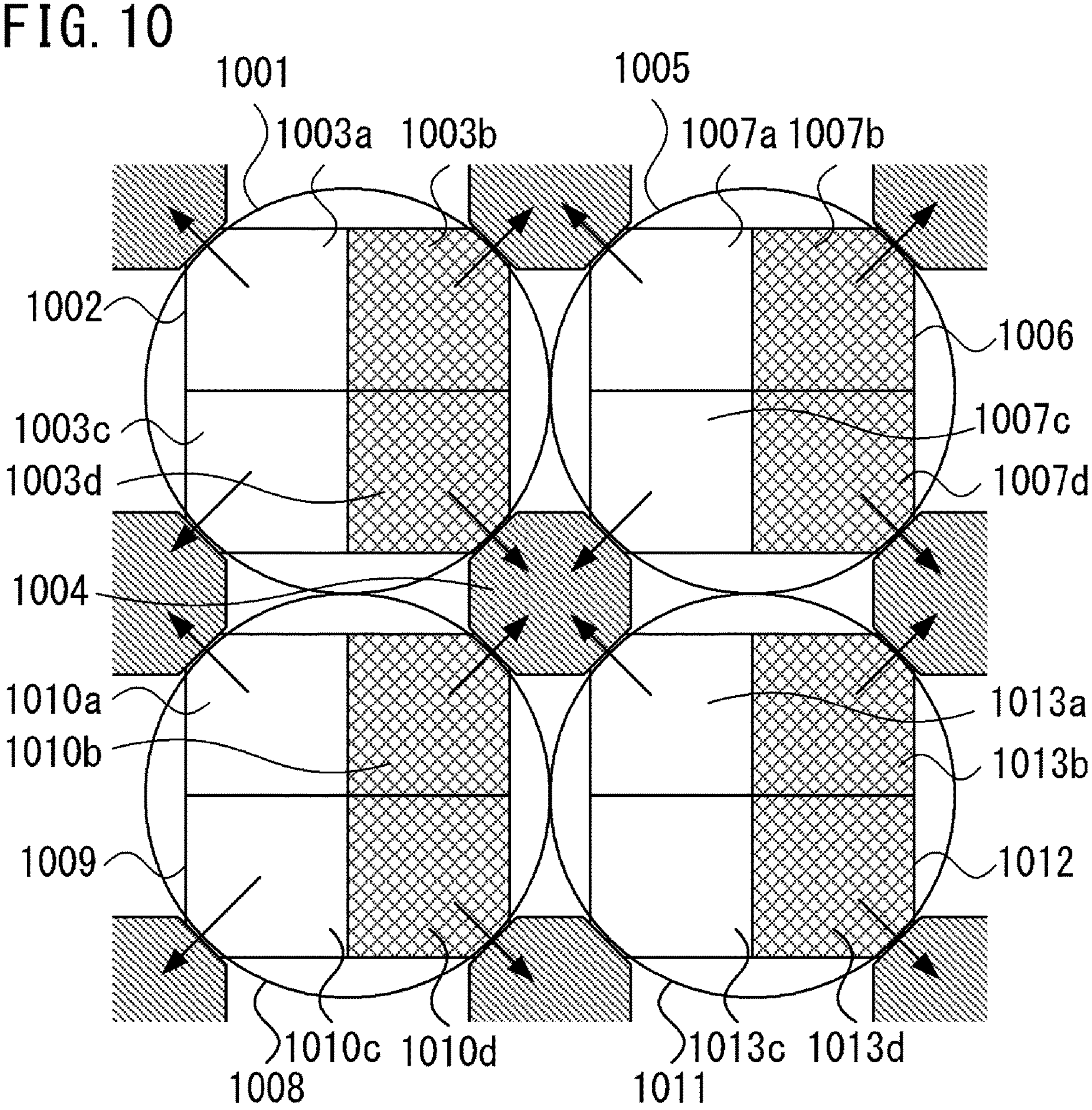
FIG. 10 is a view showing a configuration of a pixel unit according to a third embodiment.

Next, a description will be given of a solid-state imaging device according to a third embodiment. In the present embodiment, a description will be given of a configuration of a solid-state imaging element in the case where distance measurement processing in a vertical direction is executed with reference to FIG. 10. In FIG. 10, a unit pixel 1002 includes four photoelectric conversion units 1003*a* to 1003*d*. Light-shielding units which are not shown are disposed at positions where the light-shielding units overlap the photoelectric conversion units 1003*b* and 1003*d* in a plan view of the unit pixels constituting the pixel unit 201, and the sensitivity of each of the photoelectric conversion units 1003*b* and 1003*d* is lower than the sensitivity of each of the photoelectric conversion units 1003*a* and 1003*c*. Charges of the individual photoelectric conversion units in the unit pixel are simultaneously read from different FDs. While the photoelectric conversion units having the light-shielding units are arranged in a horizontal direction in the first embodiment, in the solid-state imaging element of the present embodiment, the photoelectric conversion units for a low-sensitivity image having the light-shielding units are arranged in a vertical direction, and matching in the vertical direction is performed when the distance measurement processing is performed. Consequently, in the solid-state imaging device of the present embodiment, in the distance measurement processing, matching processing is performed while the digital signal based on charges of the photoelectric conversion units disposed in the vertical direction is retained in a memory. On the other hand, in the HDR synthesis processing, charges of the photoelectric conversion units in the unit pixel are simultaneously read, and hence it is possible to execute the HDR synthesis processing without retaining the digital signal based on the charges in the memory. In addition, there is also a configuration in which the image processing unit (distance measurement processing unit) includes a memory. In this case, it is possible to perform the HDR synthesis processing without causing the memory to retain the digital signal.

Fourth Embodiment

Figure 11:
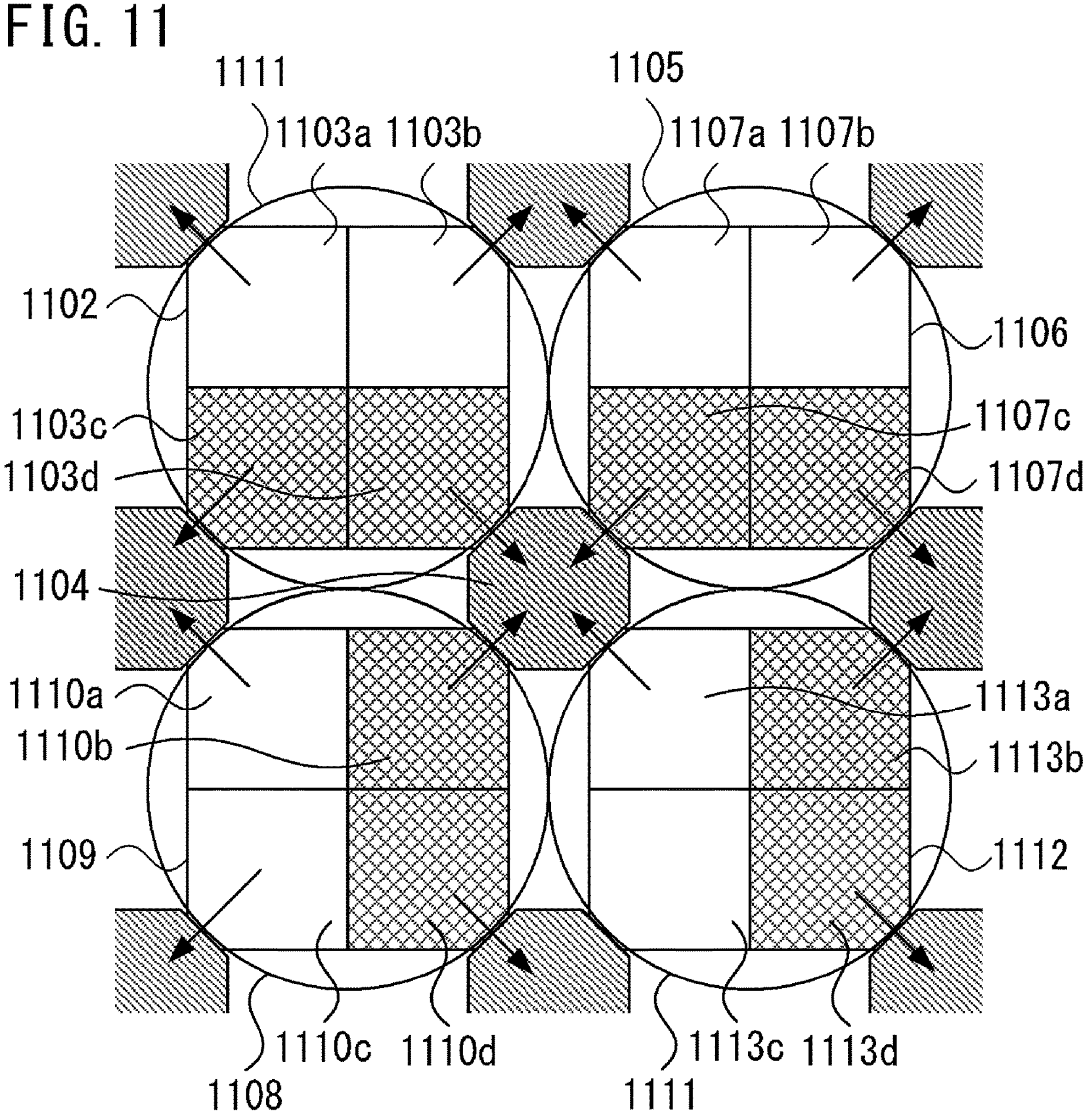
FIG. 11 is a view showing a configuration of a pixel unit according to a fourth embodiment.

Next, a description will be given of a solid-state imaging device according to a fourth embodiment. In the present embodiment, a description will be given of a configuration of a solid-state imaging element in the case where distance measurement processing in the vertical direction and the horizontal direction is executed with reference to FIG. 11. In FIG. 11, a unit pixel 1102 includes four photoelectric conversion units 1103*a* to 1103*d*. Light-shielding units which are not shown are disposed at positions where the light-shielding units overlap the photoelectric conversion units 1103*c* and 1103*d* in a plan view of the unit pixels constituting the pixel unit 201, and the sensitivity of each of the photoelectric conversion units 1103*c* and 1103*d* is lower than the sensitivity of each of the photoelectric conversion units 1103*a* and 1103*b*. In addition, photoelectric conversion units 1107*a* to 1107*d* and light-shielding units of a unit pixel 1106 are also configured similarly to the photoelectric conversion units 1103*a* to 1103*d* and the light-shielding units of the unit pixel 1102. Further, a unit pixel 1109 includes four photoelectric conversion units 1110*a* to 1110*d*. Light-shielding units which are not shown are disposed at positions where the light-shielding units overlap the photoelectric conversion units 1110*b* and 1110*d* in a plan view of the unit pixels constituting the pixel unit 201, and the sensitivity of each of the photoelectric conversion units 1110*b* and 1110*d* is lower than the sensitivity of each of the photoelectric conversion units 1110*a* and 1110*c*. In addition, photoelectric conversion units 1113*a* to 1113*d* and light-shielding units of a unit pixel 1112 are also configured similarly to the photoelectric conversion units 1110*a* to 1110*d* and the light-shielding units of the unit pixel 1109.

Charges of the photoelectric conversion units in one unit pixel are simultaneously read by different FDs. While the pixels including the light-shielding units are arranged in the horizontal direction in the first embodiment, in the solid-state imaging element of the present embodiment, a row in which the photoelectric conversion units for a low-sensitivity image including the light-shielding units are arranged in the horizontal direction and a row in which the photoelectric conversion units therefor are arranged in the vertical direction are present in a mixed manner. Consequently, in the solid-state imaging device of the present embodiment, in the distance measurement processing, matching in the horizontal direction and matching in the vertical direction are performed by using information on the rows having the same direction of arrangement of the light-shielding units. In addition, in the distance measurement processing in the vertical direction, matching processing is performed while a digital signal based on charges obtained from the unit pixel in another row is retained in a memory. On the other hand, in the HDR synthesis processing, charges of the photoelectric conversion units in the unit pixel are simultaneously read, and hence it is possible to execute the HDR synthesis processing without retaining the digital signal based on charges in the memory. In addition, there is also a configuration in which the image processing unit (distance measurement processing unit) includes a memory. In this case, it is possible to perform the HDR synthesis processing without causing the memory to retain the digital signal.

Fifth Embodiment

Figure 12:
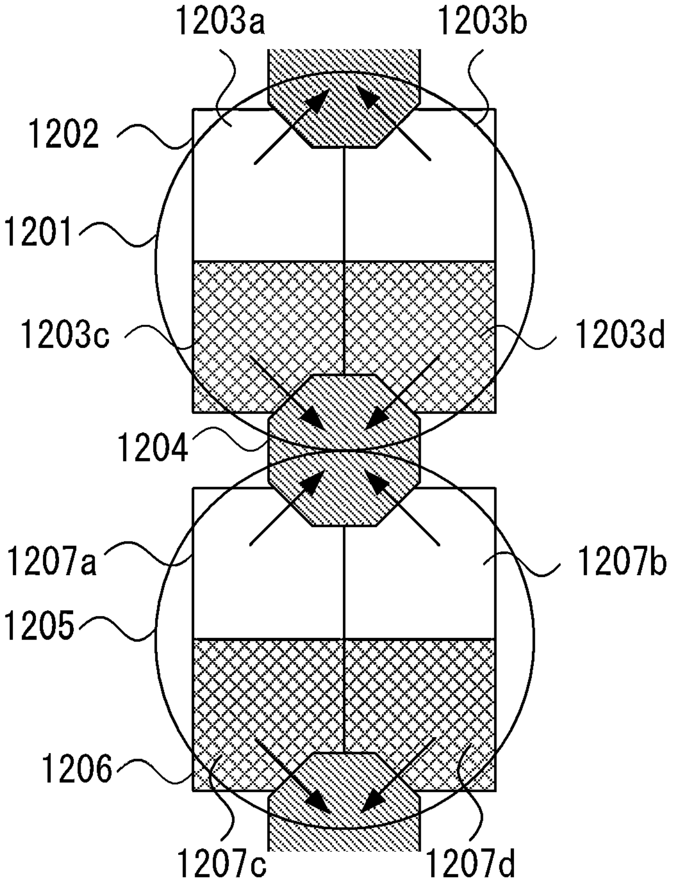
FIG. 12 is a view showing a configuration of a pixel unit according to a fifth embodiment.

Next, a description will be given of a solid-state imaging device according to a fifth embodiment with reference to FIG. 12. In the present embodiment, charges of four photoelectric conversion units constituting a unit pixel are read from two FDs. As shown in FIG. 12, a unit pixel 1202 is disposed under a microlens 1201. The unit pixel 1202 is constituted by four photoelectric conversion units having different sensitivities. Light-shielding units which are not shown are disposed at positions where the light-shielding units overlap photoelectric conversion units 1203*c* and 1203*d* in a plan view of the unit pixels constituting the pixel unit 201, and the sensitivity of each of the photoelectric conversion units 1203*c* and 1203*d* is lower than the sensitivity of each of photoelectric conversion units 1203*a* and 1203*b*. In addition, charges of the high-sensitivity photoelectric conversion units 1203*a* and 1203*b* and charges of the low-sensitivity photoelectric conversion units 1203*c* and 1203*d* are read by different FDs. In the present embodiment, for obtaining a parallax image for a high-sensitivity image, after the charge of the photoelectric conversion unit 1203*a* is read first, the charge of the photoelectric conversion unit 1203*b* is added to the charge of the photoelectric conversion unit 1203*a* in the FD and is read. In addition, with regard to a parallax image for a low-sensitivity image, similarly, after the charge of the photoelectric conversion unit 1203*c* is read first, the charge of the photoelectric conversion unit 1203*d* is added to the charge of the photoelectric conversion unit 1203*c* in the FD and is read. As a result, the charge for the high-sensitivity image and the charge for the low-sensitivity image are read from different FDs, whereby it is possible to simultaneously read these charges. Note that, as an example, a unit pixel 1206 is a first pixel, the unit pixel 1202 is a second pixel, each of photoelectric conversion units 1207*a* and 1207*b* is a first photoelectric conversion unit, and each of the photoelectric conversion units 1203*c* and 1203*d* is a second photoelectric conversion unit. In addition, photoelectric conversion units 1207*c* and 1207*d* are examples of a third photoelectric conversion unit, and the photoelectric conversion units 1203*a* and 1203*b* are examples of a fourth photoelectric conversion unit. Further, the photoelectric conversion units 1203*a*, 1203*b*, 1207*c*, and 1207*d* are examples of a photoelectric conversion unit other than the first photoelectric conversion unit and the second photoelectric conversion unit. In addition, an FD 1204 is an example of a first floating diffusion unit.

In the present embodiment, in the HDR synthesis processing, the HDR synthesis processing is performed by using the charge for the high-sensitivity image and the charge for the low-sensitivity image which are simultaneously read. While left and right parallax images are subjected to addition processing before the HDR synthesis processing in the first embodiment, it is possible to omit the addition processing of the parallax images and perform the HDR synthesis processing by generating an image by using charges subjected to addition in the FD in the present embodiment.

In addition, in the distance measurement processing, a parallax image of the right side of the microlens (the side which overlaps the photoelectric conversion units 1203*b*, 1203*d*, 1207*b*, and 1207*d* in the drawing) is acquired on the basis of a difference between charges which are read subsequently and are subjected to addition in the FD and charges which are read first and are subjected to addition in the FD. Further, a digital signal based on the charges which are read first and are subjected to addition in the FD is retained in a memory. Then, the distance measurement processing is performed by using an image of the left side of the microlens (the side which overlaps the photoelectric conversion units 1203*a*, 1203*c*, 1207*a*, and 1207*c* in the drawing) acquired based on charges which are read first and the image of the right side of the microlens acquired by the above-described processing.

Also in the present embodiment, in the HDR synthesis processing, the charge for the high-sensitivity image and the charge for the low-sensitivity image are simultaneously read, and hence it is possible to execute the HDR synthesis processing without retaining the digital signal based on the charges in the memory. In addition, in the distance measurement processing, as described above, the processing is performed while the digital signal based on the charge is retained in the memory.

Figure 13:
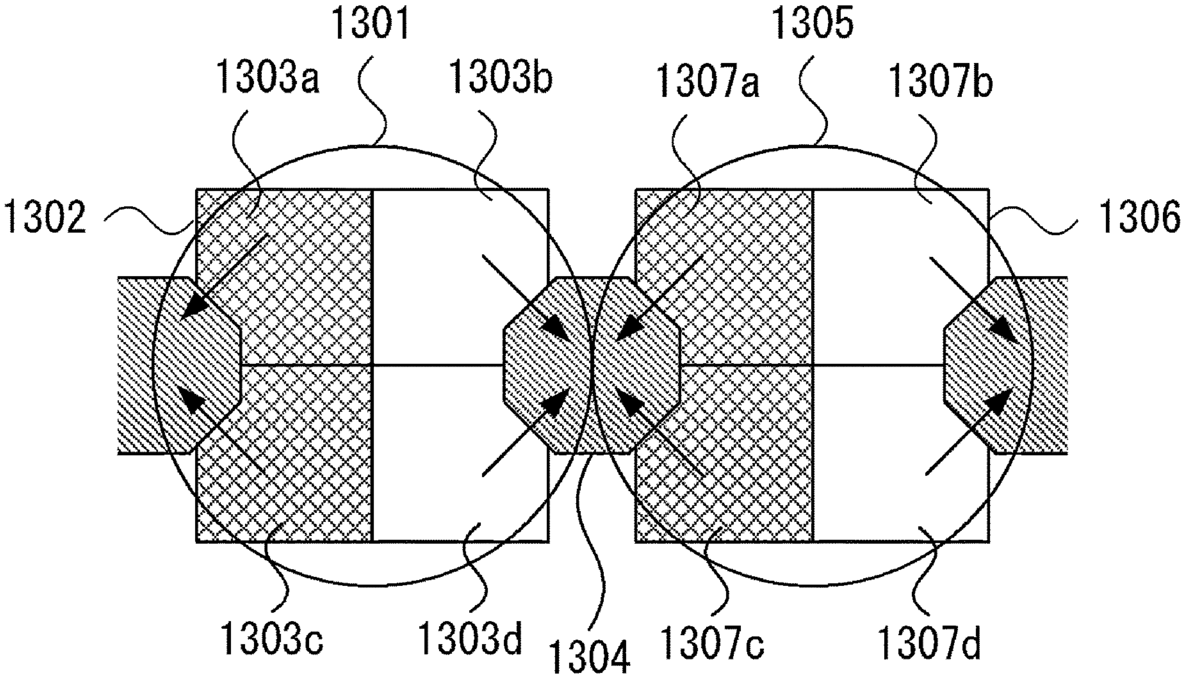
FIG. 13 is a view showing a configuration of another pixel unit according to the fifth embodiment.

Note that, while the photoelectric conversion units having a difference in sensitivity are disposed in the vertical direction in the present embodiment, the photoelectric conversion units having a difference in sensitivity may also be disposed in the horizontal direction, as shown in FIG. 13. In FIG. 13, a unit pixel 1302 is disposed under a microlens 1301. The unit pixel 1302 is constituted by four photoelectric conversion units having different sensitivities. Light-shielding units which are not shown are disposed at positions where the light-shielding units overlap photoelectric conversion units 1303*a* and 1303*c* in a plan view of the unit pixels constituting the pixel unit 201, and the sensitivity of each of the photoelectric conversion units 1303*a* and 1303*c* is lower than the sensitivity of each of photoelectric conversion units 1303*b* and 1303*d*. In addition, charges of the high-sensitivity photoelectric conversion units 1303*b* and 1303*d* and charges of the low-sensitivity photoelectric conversion units 1303*a* and 1303*c* are read by different FDs. In the present embodiment, for obtaining a parallax image for a high-sensitivity image, after the charge of the photoelectric conversion unit 1303*b* is read first, the charge of the photoelectric conversion unit 1203*d* is added to the charge of the photoelectric conversion unit 1303*b* in the FD and is read. In addition, with regard to a parallax image for a low-sensitivity image, similarly, after the charge of the photoelectric conversion unit 1303*a* is read first, the charge of the photoelectric conversion unit 1303*c* is added to the charge of the photoelectric conversion unit 1303*a* in the FD and is read. As a result, the charge for the high-sensitivity image and the charge for the low-sensitivity image are read from different FDs, whereby it is possible to simultaneously read these charges. Note that, as an example, the unit pixel 1302 is a first pixel, a unit pixel 1306 is a second pixel, each of the photoelectric conversion units 1303*b* and 1303*d* is a first photoelectric conversion unit, and each of photoelectric conversion units 1307*a* and 1307*c* is a second photoelectric conversion unit. In addition, the photoelectric conversion units 1303*a* and 1303*c* are examples of a fifth photoelectric conversion unit, and photoelectric conversion units 1307*b* and 1307*d* are examples of a sixth photoelectric conversion unit. Further, the photoelectric conversion units 1303*a*, 1303*c*, 1307*b*, and 1307*d* are examples of a photoelectric conversion unit other than the first photoelectric conversion unit and the second photoelectric conversion unit. In addition, an FD 1304 is an example of a first floating diffusion unit.

It is possible to omit the addition processing of the parallax images and perform the HDR synthesis processing by generating an image by using charges subjected to addition in the FD. In addition, in the distance measurement processing, a parallax image of the upper side of the microlens (the side which overlaps the photoelectric conversion units 1303*a*, 1303*b*, 1307*a*, and 1307*b* in the drawing) is acquired on the basis of a difference between charges which are read subsequently and are subjected to addition in the FD and charges which are read first and are subjected to addition in the FD. In addition, a digital signal based on the charges which are read first and are subjected to addition in the FD is retained in a memory. Then, the distance measurement processing is performed by using an image of the lower side of the microlens (the side which overlaps the photoelectric conversion units 1303*c*, 1303*d*, 1307*c*, and 1307*d* in the drawing) acquired on the basis of charges which are read first, and the image of the right side of the microlens acquired by the above-described processing.

Consequently, also with the configuration of the unit pixels and the photoelectric conversion units shown in FIG. 13, in the HDR synthesis processing, the charge for the high-sensitivity image and the charge for the low-sensitivity image are simultaneously read. With this, it is possible to execute the HDR synthesis processing without retaining the digital signal based on the charges in the memory. In addition, there is also a configuration in which the image processing unit (distance measurement processing unit) includes a memory. In this case, it is possible to perform the HDR synthesis processing without causing the memory to retain the digital signal.

Sixth Embodiment

Figure 14:
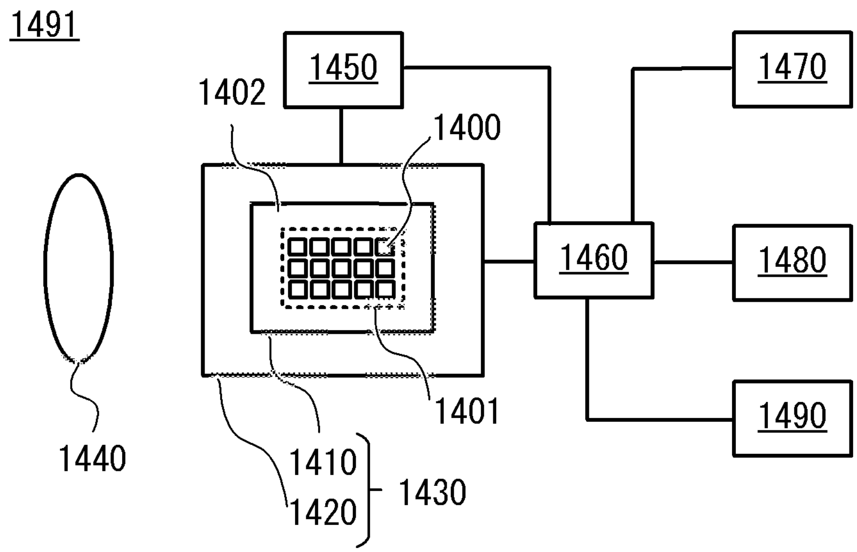
FIG. 14 is a view showing a configuration of equipment according to a sixth embodiment.

Any of the first to fifth embodiments described above can be applied to a sixth embodiment. FIG. 14 is a schematic view for explaining equipment 1491 including a semiconductor apparatus 1430 of the present embodiment. The semiconductor apparatus 1430 can be any of the imaging devices described in the first to fifth embodiments, or an imaging device obtained by combining a plurality of the embodiments. The equipment 1491 including the semiconductor apparatus 1430 will be described in detail. As described above, the semiconductor apparatus 1430 can include a semiconductor device 1410 having a semiconductor layer, and a package 1420 which houses the semiconductor device 1410. The package 1420 can include a substrate to which the semiconductor device 1410 is fixed, and a lid made of glass or the like which faces the semiconductor device 1410. The package 1420 can further include a joining member such as a bonding wire or a bump which connects a terminal provided on the substrate and a terminal provided on the semiconductor device 1410.

The equipment 1491 can include at least any of an optical device 1440, a control device 1450, a processing device 1460, a display device 1470, a storage device 1480, and a mechanical device 1490. The optical device 1440 is compliant with the semiconductor apparatus 1430. The optical device 1440 is, e.g., a lens, a shutter, or a mirror. The control device 1450 controls the semiconductor apparatus 1430. The control device 1450 is a semiconductor apparatus such as, e.g., an ASIC.

The processing device 1460 processes a signal output from the semiconductor apparatus 1430. The processing device 1460 is a semiconductor apparatus such as a CPU or an ASIC for constituting an AFE (analog front end) or a DFE (digital front end). The display device 1470 is an EL display device or a liquid crystal display device which displays information (image) obtained by the semiconductor apparatus 1430. The storage device 1480 is a magnetic device or a semiconductor device which stores information (image) obtained by the semiconductor apparatus 1430. The storage device 1480 is a volatile memory such as an SRAM or a DRAM, or a non-volatile memory such as a flash memory or a hard disk drive.

The mechanical device 1490 has a moving unit or a propulsive unit such as a motor or an engine. In the equipment 1491, a signal output from the semiconductor apparatus 1430 is displayed in the display device 1470, and is transmitted to the outside by a communication device (not shown) provided in the equipment 1491. In order to do so, it is preferable that the equipment 1491 further includes the storage device 1480 and the processing device 1460 in addition to a storage circuit and an operation circuit of the semiconductor apparatus 1430. The mechanical device 1490 may also be controlled on the basis of a signal output from the semiconductor apparatus 1430.

In addition, the equipment 1491 is suitably used as electronic equipment such as an information terminal having photographing function (e.g., a smartphone or a wearable terminal) or a camera (e.g., an interchangeable-lens camera, a compact camera, a video camera, or a surveillance camera). The mechanical device 1490 in the camera can drive components of the optical device 1440 for zooming, focusing, and shutter operation. Alternatively, the mechanical device 1490 in the camera can move the semiconductor apparatus 1430 for vibration isolation operation.

The equipment 1491 can be transport equipment such as a vehicle, a ship, or a flight vehicle. The mechanical device 1490 in the transport equipment can be used as a moving device. The equipment 1491 serving as the transport equipment is suitably used as equipment which transports the semiconductor apparatus 1430, or performs assistance and/or automation of driving (manipulation) with photographing function. The processing device 1460 for assistance and/or automation of driving (manipulation) can perform processing for operating the mechanical device 1490 serving as the moving device based on information obtained in the semiconductor apparatus 1430. Alternatively, the equipment 1491 may also be medical equipment such as an endoscope, measurement equipment such as a distance measurement sensor, analysis equipment such as an electron microscope, office equipment such as a copier, or industrial equipment such as a robot.

According to the sixth embodiment, it becomes possible to obtain excellent pixel characteristics. Consequently, it is possible to enhance the value of the semiconductor apparatus 1430. At least any of addition of function, an improvement in performance, an improvement in characteristics, an improvement in reliability, an improvement in product yield, a reduction in environmental load, a reduction in cost, a reduction in size, and a reduction in weight corresponds to the enhancement of the value thereof mentioned herein.

Consequently, if the semiconductor apparatus 1430 according to the sixth embodiment is used in the equipment 1491, it is possible to improve the value of the equipment as well. For example, when the semiconductor apparatus 1430 is mounted on transport equipment and photographing of the outside of the transport equipment or measurement of an external environment is performed, it is possible to obtain excellent performance. Therefore, when the transport equipment is manufactured and sold, it is advantageous to determine that the semiconductor apparatus 1430 according to the sixth embodiment is mounted on the transport equipment in terms of increasing the performance of the transport equipment itself. The semiconductor apparatus 1430 is suitably used particularly as the transport equipment which performs driving assistance and/or automated driving of the transport equipment by using information obtained by the semiconductor apparatus 1430.

According to the present disclosure, it is possible to reduce manufacturing cost required for the configuration in which the high dynamic range image and the parallax image are acquired in the imaging device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-089503, filed on Jun. 1, 2022, which is hereby incorporated by reference herein in its entirety.

What is claimed is:

1. An imaging device comprising:
- a plurality of pixels each of which includes a microlens and a plurality of photoelectric conversion units,
- wherein the plurality of pixels include a first pixel and a second pixel adjacent to the first pixel,
- wherein a first photoelectric conversion unit included in the first pixel and a second photoelectric conversion unit included in the second pixel are configured to share a first floating diffusion unit,
- wherein sensitivity of the second photoelectric conversion unit is lower than sensitivity of the first photoelectric conversion unit in a wavelength range in which the first photoelectric conversion unit has a peak of the sensitivity, and
- wherein the first pixel further comprises a third photoelectric conversion unit connected with a second floating diffusion unit.

2. The imaging device according to claim 1 further comprising:
- an image processing unit which performs high dynamic range image generation processing by using images having different sensitivities based on a charge read from the first floating diffusion unit,
- wherein the image processing unit includes a memory,
- wherein charges of the first photoelectric conversion unit and the second photoelectric conversion unit are added together in the first floating diffusion unit and are read, and
- wherein the image processing unit performs the image generation processing without retaining a digital signal based on the charges read from the first photoelectric conversion unit and the second photoelectric conversion unit in the memory.

3. The imaging device according to claim 1, wherein the first photoelectric conversion unit and the second photoelectric conversion unit include color filters having different transmittances of light in incidence units of the light.

4. The imaging device according to claim 1, wherein the second photoelectric conversion unit includes a light-shielding film in an incidence unit of light.

5. The imaging device according to claim 1, wherein each photoelectric conversion unit in the first pixel and the second pixel includes a color filter of the same color.

6. The imaging device according to claim 1, wherein in a configuration in which the first photoelectric conversion unit and the second photoelectric conversion unit are adjacent to each other in a vertical direction in a plan view of the plurality of pixels:
- (1)a microlens is disposed over the first photoelectric conversion unit and the third photoelectric conversion unit,
- (2) the third photoelectric conversion unit is adjacent to the first photoelectric conversion unit in the vertical direction,
- (3) the second pixel comprises a fourth photoelectric conversion unit connected with a third floating diffusion unit,
- (4) a microlens is disposed over the second photoelectric conversion unit and the fourth photoelectric conversion unit, and (5) the fourth photoelectric conversion unit is adjacent to the second photoelectric conversion unit in the vertical direction.

7. The imaging device according to claim 1, wherein in a configuration in which the first photoelectric conversion unit and the second photoelectric conversion unit are adjacent to each other in a horizontal direction in a plan view of the plurality of pixels:

(1) a microlens is disposed over the first photoelectric conversion unit and the third photoelectric conversion unit, (2) the third photoelectric conversion unit is adjacent to the first photoelectric conversion unit in the horizontal direction, (3) the second pixel comprises a fourth photoelectric conversion unit connected with a third floating diffusion unit, (4) a microlens is disposed over the second photoelectric conversion unit and the fourth photoelectric conversion unit, and (5) the fourth photoelectric conversion unit is adjacent to the second photoelectric conversion unit in the horizontal direction.

8. Equipment comprising the imaging device according to claim 1, the equipment further comprising at least any of:

an optical device which is compliant with the imaging device;

a control device which controls the imaging device;

a processing device which processes a signal output from the imaging device;

a display device which displays information obtained by the imaging device;

a storage device which stores the information obtained by the imaging device; and a mechanical device which operates on the basis of the information obtained by the imaging device.

9. An imaging device comprising:

a plurality of pixels each of which includes a microlens and a plurality of photoelectric conversion units, wherein the plurality of pixels include (a) a seventh pixel, (b) an eighth pixel adjacent to the seventh pixel, (c) a ninth pixel adjacent to the eighth pixel, and (d) a tenth pixel adjacent to the ninth pixel, wherein a seventh photoelectric conversion unit included in the seventh pixel, an eighth photoelectric conversion unit included in the eighth pixel, a ninth photoelectric conversion unit included in the ninth pixel, and a tenth photoelectric conversion unit included in the tenth pixel are configured to share a second floating diffusion unit, wherein in a wavelength range in which one of at least two photoelectric conversion units among the seventh photoelectric conversion unit, the eighth photoelectric conversion unit, the ninth photoelectric conversion unit, and the tenth photoelectric conversion unit has a peak of sensitivity, another one of the at least two photoelectric conversion units has sensitivity different from the sensitivity of the one of the at least two photoelectric conversion units, and wherein the seventh pixel further comprises an eleventh photoelectric conversion unit connected with a third floating diffusion unit.

10. The imaging device according to claim 9, further comprising:

a distance measurement processing unit which acquires a parallax image based on a charge read from the second floating diffusion unit and performs distance measurement processing, and includes a memory, wherein an adjacent photoelectric conversion unit adjacent to the seventh photoelectric conversion unit in a horizontal direction in a plan view of the plurality of pixels has sensitivity identical to sensitivity of the seventh photoelectric conversion unit in a wavelength range in which the seventh photoelectric conversion unit has a peak of the sensitivity, and wherein the distance measurement processing unit acquires the parallax image and performs the distance measurement processing without retaining a digital signal based on charges read from the seventh photoelectric conversion unit and the adjacent photoelectric conversion unit in the memory.

11. The imaging device according to claim 9, further comprising:

an image processing unit which performs high dynamic range image generation processing by using images having different sensitivities based on a charge read from the second floating diffusion unit, wherein the image processing unit includes a memory, wherein an adjacent photoelectric conversion unit adjacent to the seventh photoelectric conversion unit in a horizontal direction in a plan view of the plurality of pixels has sensitivity different from sensitivity of the seventh photoelectric conversion unit in a wavelength range in which the seventh photoelectric conversion unit has a peak of the sensitivity, and wherein the image processing unit performs the image generation processing without retaining a digital signal based on charges read from the seventh photoelectric conversion unit and the adjacent photoelectric conversion unit in a memory.

12. The imaging device according to claim 9, wherein the at least two photoelectric conversion units having different sensitivities to light having the same wavelength include color filters having different transmittances in incidence units of light.

13. The imaging device according to claim 9, wherein one of the at least two photoelectric conversion units having different sensitivities to light having the same wavelength which has lower sensitivity includes a light-shielding film in an incidence unit of light.

14. The imaging device according to claim 9, wherein each photoelectric conversion unit in the seventh pixel, the eighth pixel, the ninth pixel, and the tenth pixel includes a color filter of the same color.

15. Equipment comprising the imaging device according to claim 9, the equipment further comprising at least any of:

an optical device which is compliant with the imaging device;

a control device which controls the imaging device;

a processing device which processes a signal output from the imaging device;

a display device which displays information obtained by the imaging device;

a storage device which stores the information obtained by the imaging device; and a mechanical device which operates on the basis of the information obtained by the imaging device.

* * * * *